United States Patent
Yang et al.

(10) Patent No.: US 9,234,933 B2
(45) Date of Patent: Jan. 12, 2016

(54) SOLAR CELL TESTING SYSTEM, SOLAR CELL TESTING METHOD, AND MULTIFUNCTIONAL TESTING LIGHT SOURCE

(71) Applicant: Chroma ATE Inc., Taoyuan County (TW)

(72) Inventors: Lan-Sheng Yang, Taoyuan County (TW); I-Shih Tseng, Taoyuan County (TW); Ching-Lin Lee, Taoyuan County (TW); Ming-Chieh Lin, Taoyuan County (TW); Yi-Lung Weng, Taoyuan County (TW)

(73) Assignee: CHROMA ATE INC., Taoyuan County (TW)

( * ) Notice: Subject to any disclaimer, the term of this patent is extended or adjusted under 35 U.S.C. 154(b) by 106 days.

(21) Appl. No.: 13/716,100

(22) Filed: Dec. 15, 2012

(65) Prior Publication Data
US 2013/0265077 A1 Oct. 10, 2013

(30) Foreign Application Priority Data
Apr. 10, 2012 (CN) .......................... 2012 1 1025986

(51) Int. Cl.
*G01R 31/26* (2014.01)
*H02S 50/10* (2014.01)
*F21S 8/00* (2006.01)
*F21Y 101/02* (2006.01)

(52) U.S. Cl.
CPC ............ *G01R 31/2605* (2013.01); *H02S 50/10* (2014.12); *F21S 8/006* (2013.01); *F21Y 2101/02* (2013.01)

(58) Field of Classification Search
CPC .......... G06F 11/2294; G06F 17/30126; G06F 17/30855; G06F 11/3495; G06F 3/1285; G06F 11/3409; G06F 11/34; G06K 9/624; G06K 9/00523; G06K 9/0057; G06K 9/6242; G06K 9/0055; G06K 9/00986; G06K 9/6212; G06K 9/6215; G06K 9/6217; Y02E 10/50; Y02E 10/52; Y02E 10/547; Y02E 10/56; H01G 9/2068; H01G 9/20; G01J 1/0407; G02F 1/133603; G02F 1/13439; G02F 2001/13324; G01R 1/0408; G01R 31/2605; H01L 31/055
USPC ............... 324/765, 761.01, 754.23, 403, 713; 702/196
See application file for complete search history.

(56) References Cited

U.S. PATENT DOCUMENTS

| | | | |
|---|---|---|---|
| 7,251,397 B2 * | 7/2007 | Adachi et al. | 385/37 |
| 8,239,165 B1 * | 8/2012 | Young et al. | 702/182 |
| 2004/0096226 A1 * | 5/2004 | Hiironen et al. | 398/202 |
| 2011/0018465 A1 * | 1/2011 | Ashdown | 315/294 |
| 2011/0241719 A1 * | 10/2011 | Shr et al. | 324/761.01 |
| 2012/0101782 A1 * | 4/2012 | Wang et al. | 702/196 |

FOREIGN PATENT DOCUMENTS

TW 201217800 A1 5/2012

* cited by examiner

*Primary Examiner* — Vinh Nguyen
(74) *Attorney, Agent, or Firm* — Chun-Ming Shih

(57) ABSTRACT

A solar cell testing system includes a multifunctional testing light source, a measuring unit, and an arithmetic unit. The multifunctional testing light source is configured to be switched to output a simulated solar light to a solar cell or asynchronously output a plurality of narrowband lights to the solar cell. The measuring unit is coupled to the solar cell and measures the solar cell's response to the simulated solar light and response to the asynchronously outputted narrowband lights. The arithmetic unit is coupled to the multifunctional testing light source and the measuring unit; it determines the solar cell's conversion efficiency and spectral response based on the solar cell's response to the simulated solar light and response to the asynchronously outputted narrowband lights.

6 Claims, 2 Drawing Sheets

| LED type | Peak wavelength (nm) | Bandwidth (nm) | Rated/maximum power (mW) |
| --- | --- | --- | --- |
| 1 | 365 | 12 | 120 |
| 2 | 385 | 12 | 120 |
| 3 | 405 | 12 | 350 |
| 4 | 460 | 30 | 550 |
| 5 | 515 | 35 | 172 |
| 6 | 590 | 20 | 30.6 |
| 7 | 624 | 19 | 163 |
| 8 | 655 | 20 | 96 |
| 9 | 680 | 25 | 12 |
| 10 | 735 | 30 | 24 |
| 11 | 780 | 25 | 30 |
| 12 | 810 | 40 | 30 |
| 13 | 850 | 50 | 32 |
| 14 | 880 | 40 | 23 |
| 15 | 940 | 50 | 24 |
| 16 | 1050 | 60 | 14 |
| 17 | White light | White light | 60 |
| 18 | White light | White light | 70 |

FIG. 2

SOLAR CELL TESTING SYSTEM, SOLAR CELL TESTING METHOD, AND MULTIFUNCTIONAL TESTING LIGHT SOURCE

CROSS-REFERENCE TO RELATED APPLICATIONS

This application claims the priority benefit of China application serial no. 2012101025986, filed on Apr. 10, 2012. The entirety of the above-mentioned patent application is hereby incorporated by reference herein and made a part of specification.

BACKGROUND

1. Technical Field

The invention relates to solar cells, and more particularly, to a solar cell testing system, a solar cell testing method, and a multifunctional testing light source.

2. Related Art

Existing minerals that may be used to generate electricity, such as crude oil and coal, are being exhausted. Furthermore, thermal power plants have been exacerbating global warming. As a result, it is critical for the human being to develop and promote alternative energy that is sustainable. Among all potential sources of sustainable alternative energy, solar energy is a kind that's relatively more popular.

Not only do suppliers try to enhance solar cells' conversion efficiency, but conversion efficiency is also used to evaluate the quality of solar cells. For example, a 0.2% difference in conversion efficiency may lead to a huge disparity in price.

Suppliers frequently use artificial light sources to simulate sun light defined as AM1.5G in order to determine solar cells' conversion efficiency. Specifically, these artificial light sources may simulate the situation that the sun light incidents from an angle 48.2 degrees away from the vertical angle (i.e. zenith angle). However, artificial light sources seldom can match the AM1.5G specification exactly. Inevitably, this causes the tolerance for errors to be relatively large. For example, as defined by the IEC60904-9 standard, as long as a light source has less than 25% deviation in energy within each and every predetermined light band, the light source may be certified as a class-A light source. Because of the loose requirement, several class-A AM1.5G light sources may have quite different spectra. For example, one of the light sources may have relatively more energy in the band of blue light, while another light source may have relatively more energy in the band of red light. These light sources may not be sufficient to enable the determination of whether a solar cell has a 0.2% deviation in conversion efficiency.

Regardless of whether a single class-A light source or a plurality of class-A light sources are used, when the testing result indicates that two solar cells have the same conversion efficiency, the two cells may still have different spectral responses on different light bands. For example, one of the solar cells may have relatively stronger response to blue light, and the other may have relatively stronger response to red light. If these two solar cells are connected in series, they will hinder each other's performance regardless of whether the series circuit is receiving light with relatively more energy in the blue or red band. In other words, because of the mismatch between the two solar cells, the series circuit may not have optimal performance in supplying photo current.

To avoid errors in classification, a solar-cell supplier may measure a solar cell's spectral response additionally, and then infer the solar cell's quantum efficiency (QE). However, conventional methods of measuring spectral response are not only slow but also costly. As a result, the methods are not popularly used on solar cell production lines.

Therefore, solar cell suppliers likely will be interested in artificial light sources that not only may simulate AM1.5G light more precisely but also have smaller inter-machine variation. These suppliers likely will also be interested in methods and testing systems that may measure a solar cell's spectral response at a high throughput and low costs.

BRIEF SUMMARY

One of the objectives of the invention is to solve the above mentioned problem and others by providing a solar cell testing system, a solar cell testing method, and a multifunctional testing light source.

An embodiment of the invention provides a solar cell testing system. The system includes a multifunctional testing light source, a measuring unit, and an arithmetic unit. The multifunctional testing light source is configured to be switched to output a simulated solar light to a solar cell, or asynchronously output a plurality of narrowband lights to the solar cell. The measuring unit is coupled to the solar cell, and is configured to measure a response of the solar cell to the simulated solar light and a response of the solar cell to the asynchronously outputted narrowband lights. The arithmetic unit is coupled to the multifunctional testing light source and the measuring unit, and is configured to calculate a conversion efficiency and a spectral response of the solar cell based on the response of the solar cell to the simulated solar light and the response of the solar cell to the asynchronously outputted narrowband lights.

Another embodiment of the invention provides a multifunctional testing light source. The multifunctional testing light source includes a light-emitting diode (LED) array of a plurality of types of LEDs, a light mixer, and a driving unit. The driving unit is coupled to LED array, and is configured to be switched to drive the LEDs to output a simulated solar light through the light mixer, or drive the LEDs to asynchronously output a plurality of narrowband lights through the light mixer.

Another embodiment of the invention provides a solar cell testing method. The method include: driving a multifunctional testing light source to output a simulated solar light to a solar cell, and measuring a response of the solar cell to the simulated solar light; driving the multifunctional testing light source to asynchronously output a plurality of narrowband lights to the solar cell, and measuring a response of the solar cell to the asynchronously outputted narrowband lights; and calculating a conversion efficiency and a spectral response of the solar cell based on the response of the solar cell to the simulated solar light and the response of the solar cell to the asynchronously outputted narrowband lights.

Other features of the present invention will be apparent from the accompanying drawings and from the detailed description which follows.

BRIEF DESCRIPTION OF THE DRAWINGS

The invention is fully illustrated by the subsequent detailed description and the accompanying drawings, in which like references indicate similar elements.

FIG. 2 shows a table listing several exemplary types of LEDs of the LED array of FIG. 1.

DETAILED DESCRIPTION

Figure 1:
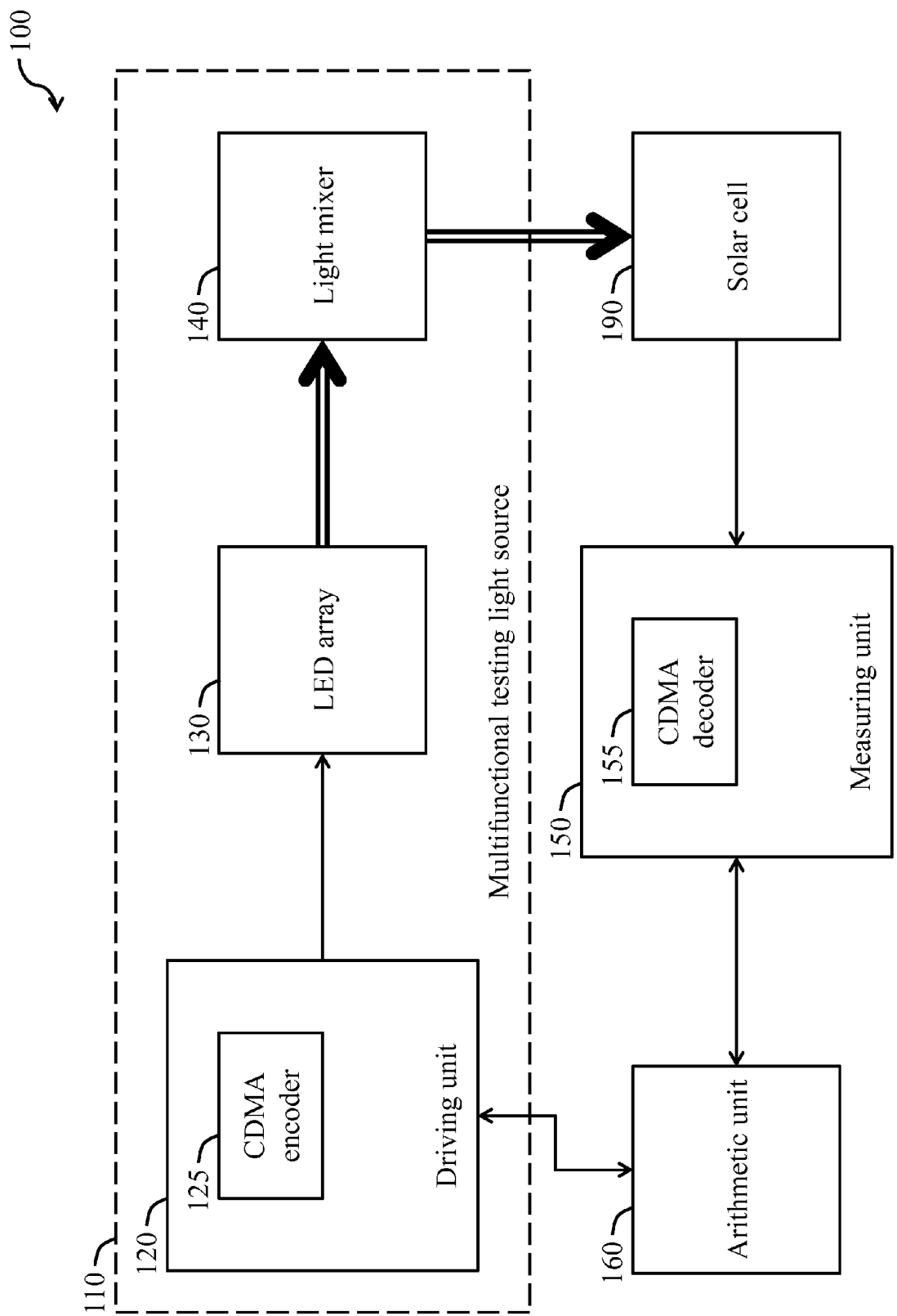
FIG. 1 shows a solar cell testing system according to an embodiment of the invention.

FIG. 1 shows a solar cell testing system 100 according to an embodiment of the invention. The solar cell testing system 100 of this embodiment includes a multifunctional testing light source 110, a measuring unit 150, and an arithmetic unit 160. The testing system 100 may be used to test a solar cell 190, which is not a part of the testing system 100. The multifunctional testing light source 110 includes a driving unit 120, an LED array 130, and a light mixer 140. To put it simply, the solar cell testing system 100 may be installed on a production line so as to measure the conversion efficiency and spectral response of solar cells 190 one after another at a high throughput. Because the system 100 uses LEDs as it source of light, it is advantageous in having a relatively longer life and relatively lower power consumption.

The LED array 130 has several types of LEDs. Each type may have a single LED or several LEDs driven by a same driving signal. The driving unit 120 may be switched to drive the LED array 130 to output a simulated solar light or asynchronously output a plurality of narrowband lights. When the driving unit 120 drives some or all of the LEDs of the LED array 130 to illuminate together so as to provide the simulated solar light, the system 100 may determine the solar cell 190's conversion efficiency. When the driving unit 120 drives different types of LEDs of the LED array 130 to illuminate asynchronously, the LED array 130 supplies the narrowband lights asynchronously. This allows the system 100 to determine the solar cell 190's spectral response. For example, in order to simulate AM1.5G solar light, the LED array 130 may include at least a type of white LED and several types of narrowband LEDs. Herein each narrowband light is a visible or invisible light with a bandwidth narrower than 100 nm. Each of the visible narrowband lights may have a specific color other than white. The table in FIG. 2 lists an exemplary combination of several types of LEDs that forms the LED array 130.

The light mixer 140 mixes the lights generated by the LED array 130 so that the solar cell 190 may receive a light beam that is well-blended. The light mixer 140 may be a rectangular cuboid. The rectangular cuboid may have an upper face connected to the LED array 130, four lateral inner faces formed by reflective material (such as silver), and a bottom face having a beam splitter and a brightness enhancement film. The solar cell 190 may be placed beneath the bottom face of the light mixer 140.

The measuring unit 150 may measure a first electrical signal, which may be a current or a voltage signal, the solar cell 190 generates in response to the simulated solar light. The first electrical signal may be used to represent the solar cell 190's response to the simulated solar light. The measuring unit 150 may measure a second electrical signal, which may be a current or a voltage signal, the solar cell 190 generates in response to the asynchronously outputted narrowband lights. The second electrical signal may be used to represent the solar cell 190's response to the asynchronously outputted narrowband lights. The arithmetic unit 160 may be a computer. Based on the solar cell 190's response to the simulated solar light and response to the asynchronously outputted narrowband lights, the arithmetic unit 160 may calculate the solar cell 190's conversion efficiency and spectral response. In addition, based on the solar cell 190's spectral response, the arithmetic unit 160 may further infer the solar cell 190's quantum efficiency, energy gap, or carrier diffusion length. Furthermore, based on the solar cell 190's spectral response, the arithmetic unit 160 may offset measurement errors contained in the determined conversion efficiency of each solar cell 190.

Because different types of LEDs of the LED array 130 use different driving signals, the driving unit 120 may adjust the amplitudes and/or duty cycles of the driving signals in order to make the simulated solar light closely approach AM1.5G. In fact, when being compared with AM1.5G, not only does the simulated solar light's spectral mismatch satisfy the IEC60904-9 standard, but the error on each band is smaller than 5%. In addition, the simulated solar lights generate by different multifunctional testing light sources 110 resemble each other closely. As a result, even if several solar cell testing systems 100 are used to test a batch of solar cells 190, the small inter-machine variation among the solar cell testing systems 100 may avoid misclassification on the solar cells 190.

To let the testing system 100 determine the solar cell 190's response to each of the narrowband lights, the testing system 100 may take advantage of the concept of Code Division Multiple Access (CDMA). For example, the driving unit 120 may include a CDMA encoder 125 that supplies several sets of mutually orthogonal codes. The driving unit 120 may use the sets of mutually orthogonal codes to drive the types of narrowband LEDs of the LED array 130, respectively. The measuring unit 150 may include a CDMA decoder 155 that uses the sets of mutually orthogonal codes to decode the solar cell 190's response to each narrowband light from the second electrical signal. For example, to measure the solar cell 190's responses to lights generated by the 16 types of narrowband LEDs listed in FIG. 2, there may be 16 sets of mutually orthogonal codes. The 16 sets of codes may be 16 rows among a 32×32 Walsh-Hadamard Matrix. A Walsh-Hadamard Matrix has $2^k$ rows and $2^k$ columns, where k is an integer. Each value in the matrix is either +1 or −1. Excluding the first row that has only +1s, the remaining $(2^k-1)$ rows are $(2^k-1)$ sets of mutually orthogonal codes. The following examples are a 2×2 Walsh-Hadamard Matrix, a 4×4 Walsh-Hadamard Matrix, and a $2^k \times 2^k$ Walsh-Hadamard Matrix:

$$H(2^1) = \begin{bmatrix} 1 & 1 \\ 1 & -1 \end{bmatrix}$$

$$H(2^2) = \begin{bmatrix} 1 & 1 & 1 & 1 \\ 1 & -1 & 1 & -1 \\ 1 & 1 & -1 & -1 \\ 1 & -1 & -1 & 1 \end{bmatrix}$$

$$H(2^k) = \begin{bmatrix} H(2^{k-1}) & H(2^{k-1}) \\ H(2^{k-1}) & -H(2^{k-1}) \end{bmatrix}$$

The following examples are 16 sets of mutually orthogonal codes that may be used by the CDMA encoder 125 and the CDMA decoder 155:

$a_1$=[1 −1 1 −1 1 −1 1 −1 1 −1 1 −1 1 −1 1 −1 1 −1 1 −1 1 −1 1 −1 1 −1 1 −1 1 −1 1 −1]

$a_2$=[1 1 −1 −1 1 1 −1 −1 1 1 −1 −1 1 1 −1 −1 1 1 −1 −1 1 1 −1 −1 1 1 −1 −1 1 1 −1 −1]

$a_3$=[1 −1 −1 1 1 −1 −1 1 1 −1 −1 1 1 −1 −1 1 1 −1 −1 1 1 −1 −1 1 1 −1 −1 1 1 −1 −1 1]

$a_4$=[1 1 1 1 −1 −1 −1 −1 1 1 1 1 −1 −1 −1 −1 1 1 1 1 −1 −1 −1 −1 1 1 1 1 −1 −1 −1 −1]

$a_5$=[1 −1 1 −1 −1 1 −1 1 1 −1 1 −1 −1 1 −1 1 1 −1 1 −1 −1 1 −1 1 1 −1 1 −1 −1 1 −1 1]

$a_6$=[1 1 −1 −1 −1 −1 1 1 1 1 −1 −1 −1 −1 1 1 1 1 −1 −1 −1 −1 1 1 1 1 −1 −1 −1 −1 1 1 1]

$a_7$=[1 −1 −1 1 −1 1 1 −1 −1 1 1 −1 1 1 −1 1 −1 −1 1 −1 1 1 −1 1 −1 −1 1 1 −1 1 1 −1]

$a_8$=[1 1 1 1 1 1 1 1 −1 −1 −1 −1 −1 −1 −1 −1 1 1 1 1 1 1 1 1 −1 −1 −1 −1 −1 −1 −1 −1]

$a_9$=[1 −1 1 −1 1 −1 1 −1 1 −1 1 −1 1 −1 1 −1 1 −1 1 −1 1 −1 1 −1 1 −1 1 −1 1 −1 1 −1]

$a_{10}$=[1 1 −1 −1 1 1 −1 −1 −1 −1 1 1 −1 −1 1 1 1 1 −1 −1 1 1 −1 −1 −1 −1 1 1 −1 −1 1 1]

$a_{11}$=[1 −1 −1 1 1 −1 −1 1 −1 1 1 −1 −1 1 1 −1 1 −1 −1 1 1 −1 −1 1 −1 1 1 −1 −1 1 1 −1]

$a_{12}$=[1 1 1 1 −1 −1 −1 −1 −1 −1 −1 −1 1 1 1 1 1 1 1 1 −1 −1 −1 −1 −1 −1 −1 −1 1 1 1 1]

$a_{13}$=[1 −1 1 −1 −1 1 −1 1 −1 1 −1 1 1 −1 1 −1 1 −1 1 −1 −1 1 −1 1 −1 1 −1 1 1 −1 1 −1]

$a_{14}$=[1 1 −1 −1 −1 −1 1 1 −1 −1 1 1 1 1 −1 −1 1 1 −1 −1 −1 −1 1 1 −1 −1 1 1 1 1 −1 −1]

$a_{15}$=[1 −1 −1 1 −1 1 1 −1 −1 1 1 −1 1 −1 −1 1 1 −1 −1 1 −1 1 1 −1 −1 1 1 −1 1 −1 −1 1]

$a_{16}$=[1 1 1 1 1 1 1 1 1 1 1 1 1 1 1 1 −1 −1 −1 −1 −1 −1 −1 −1 −1 −1 −1 −1 −1 −1 −1 −1]

Using $a_i(n)$ to represent the nth value of code $a_i$, wherein i is an integer between 1 and 16 and n is an integer between 1 and 32, the following three equations will be true:

$$\sum_{n=1}^{32} a_i(n) = 0$$

$$\sum_{n=1}^{32} a_i^2(n) = 32$$

$$\sum_{n=1}^{32} a_i(n)a_j(n) = 0,$$

j is an integer between 1 and 16 but is not equal to i.

The driving unit 120 may use code $a_i$ to drive the ith type of LED(s) of the LED array 130. Because each of the codes has 32 values, the period during which the driving unit 120 drives the LED array 130 may be divided into 32 sub-intervals, including $T_1, T_2, T_3, \ldots,$ and $T_{32}$. If $a_i(n)$ is equal to +1, the driving unit 120 should light up the ith type of LED(s) of the LED array 130 during sub-interval $T_n$. If, on the other hand, $a_i(n)$ is equal to −1, the driving unit 120 should not light up the ith type of LED(s) of the LED array 130 during sub-interval $T_n$.

If the light provided by the ith type of LED(s) of the LED array 130 will cause the solar cell 190 to supply a photo current of $l_i$, the photo current $L_i(n)$ the solar cell 190 generates during sub-interval $T_n$ as affected by the ith type of LED(s) should be equal to $l_i \times 1/2 \times [a_i(n)+1)]$. Specifically, when $a_i(n)=+1, L_i(n)=l_i$; when $a_i(n)=−1, L_i(n)=0$. As a result, during sub-interval $T_n$, the photo current $L(n)$ the solar cell 190 generates as affected by the 16 types of narrowband LEDs should be equal to $$\sum_{i=1}^{16} \{l_i \times 1/2 \times [a_i(n) + 1]\}.$$

For any integer j between 1 and 16, the following equation will be true:

$$\sum_{n=1}^{32} L(n) \times a_j(n) = \frac{1}{2}\sum_{n=1}^{32}\sum_{i=1}^{16}[l_i \times a_i(n) \times a_j(n)] +$$

$$\frac{1}{2}\sum_{n=1}^{32}\sum_{i=1}^{16}[l_i \times a_j(n)]$$

$$= \frac{1}{2} \times 32 l_j + 0$$

$$= 16 l_j$$

Because $L(n)$ is the second electrical signal the measuring unit 150 obtains and $a_j(n)$ is known to the CDMA decoder 155, the CDMA decoder 155 may use the above equation to determine the photo current $l_j$ the solar cell 190 supplies in response to the light provided by the jth type of narrowband LED(s) of the LED array 130. Because j could be any integer between 1 and 16, the CDMA decoder 155 may determine the photo current the solar cell 190 supplies in responses to any of the types of LED(s) enlightened. Because the light strength of each of the types of narrowband LEDs and the spectrum of each of the types of LEDs may be ascertained in advance, the arithmetic unit 160 may calculate the solar cell 190's spectral response based on the data provided by the measuring unit 150.

Because each set of the codes has equal numbers of +1s and −1s, the surrounding light will be multiplied by +1 half of the time and by −1 the other half of the time. The sum of the resulting values should be equal to 0. As a result, the testing system 100 is relatively immune from the surrounding light's effect when measuring the solar cell 190's spectral response.

In sum, the solar cell testing system 100, as a single set of equipment, may provide a simulated solar light that is accurate enough for measuring the solar cell 190's conversion efficiency. In addition, the system 100 may measure the solar cell 190's spectral response quickly. The inter-machine variation among several testing systems could be minimized. Each testing system has a relatively longer life and relatively lower power consumption. As a result, a factory may use several solar cell testing systems on its production line, accurately classifying each piece of mass-produced solar cells. After being modulated, e.g. connected in series, each piece of the accurately classified solar cells should be able to bring its conversion efficiency almost into full play.

In the foregoing detailed description, the invention has been described with reference to specific exemplary embodiments thereof. It will be evident that various modifications may be made thereto without departing from the spirit and scope of the invention as set forth in the following claims. The detailed description and drawings are, accordingly, to be regarded in an illustrative sense rather than a restrictive sense.

What is claimed is:

1. A solar cell testing system, comprising:
a multifunctional testing light source, configured to be switched to output a simulated solar light to a solar cell or asynchronously output a plurality of narrowband lights to the solar cell, wherein the multifunctional testing light source comprises:
an LED array, comprising a plurality of types of LEDs;
a light mixer, set between the LED array and the solar cell; and
a driving unit, coupled to the LED array, configured to be switched to drive the types of LEDs to output the simulated solar light through the light mixer, or drive the types of LEDs to asynchronously output the narrowband lights through the light mixer;

a measuring unit, coupled to the solar cell, configured to measure a response of the solar cell to the simulated solar light and a response of the solar cell to the asynchronously outputted narrowband lights; and an arithmetic unit, coupled to the multifunctional testing light source and the measuring unit, configured to calculate a conversion efficiency and a spectral response of the solar cell based on the response of the solar cell to the simulated solar light and the response of the solar cell to the asynchronously outputted narrowband lights, wherein the driving unit comprises an encoder, configured to provide a plurality of sets of mutually orthogonal codes to the driving unit, the driving unit asynchronously drives the types of LEDs to output the narrowband lights according to the mutually orthogonal codes, and the measuring unit comprises a decoder, configured to produce a response of the solar cell to each of the narrowband lights by decoding the response of the solar cell to the asynchronously outputted narrowband lights using the sets of mutually orthogonal codes.

2. The solar cell testing system of claim 1, wherein the encoder is a CDMA encoder and the decoder is a CDMA decoder.

3. The solar cell testing system of claim 1, wherein the LED array comprises at least one type of white LED and at least ten types of narrowband LEDs.

4. A solar cell testing method, comprising:
driving a multifunctional testing light source to output a simulated solar light to a solar cell, and measuring a response of the solar cell to the simulated solar light;
calculating a conversion efficiency of the solar cell based on the response of the solar cell to the simulated solar light;
driving the multifunctional testing light source to asynchronously output a plurality of narrowband lights to the solar cell, and measuring a response of the solar cell to the asynchronously outputted narrowband lights; and
calculating a spectral response of the solar cell based on the response of the solar cell to the asynchronously outputted narrowband lights.

5. The solar cell testing method of claim 4, wherein the multifunctional testing light source comprises an LED array, and the LED array comprises at least a type of white LED and at least ten types of narrowband LEDs.

6. The solar cell testing method of claim 4, further comprising:
using a plurality of sets of mutually orthogonal codes as a basis to drive the narrowband LEDs to asynchronously output the narrowband lights; and
using the sets of mutually orthogonal codes to decode the response of the solar cell to the asynchronously outputted narrowband lights to produce a response of the solar cell to each of the narrowband lights.

* * * * *